(12) United States Patent
Venkatesh et al.

(10) Patent No.: US 9,419,597 B1
(45) Date of Patent: Aug. 16, 2016

(54) POWER-EFFICIENT CHOPPING SCHEME FOR OFFSET ERROR CORRECTION IN MEMS GYROSCOPES

(71) Applicant: Analog Devices Global, Hamilton (BM)

(72) Inventors: Achal Venkatesh, Bangalore (IN); Abhinav Kumar Dikshit, Varanasi (IN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/739,470

(22) Filed: Jun. 15, 2015

(51) Int. Cl.
  *H03K 5/12* (2006.01)
  *H03K 5/08* (2006.01)
  *H03K 5/24* (2006.01)

(52) U.S. Cl.
  CPC .. *H03K 5/12* (2013.01); *H03K 5/08* (2013.01); *H03K 5/24* (2013.01)

(58) Field of Classification Search
  CPC .............. H03K 5/08; H03K 5/12; H03K 5/24
  USPC .................................................. 327/124, 184
  See application file for complete search history.

(56) References Cited

U.S. PATENT DOCUMENTS

| | | | |
|---|---|---|---|
| 2,986,943 A | 6/1961 | Lair et al. | 74/5.4 |
| 4,825,260 A | 4/1989 | Hendow et al. | 356/350 |
| 5,783,897 A | 7/1998 | Okaguchi | 310/316 |
| 6,456,170 B1 * | 9/2002 | Segawa | H03K 3/0231 327/50 |
| 8,113,050 B2 | 2/2012 | Acar et al. | 73/504.04 |
| 8,677,801 B1 | 3/2014 | Clark et al. | 73/1.37 |
| 8,742,964 B2 | 6/2014 | Kleks et al. | 341/143 |
| 8,783,103 B2 | 7/2014 | Clark et al. | 73/504.12 |

* cited by examiner

*Primary Examiner* — William Hernandez
(74) *Attorney, Agent, or Firm* — Sunstein Kann Murphy & Timbers LLP

(57) ABSTRACT

Embodiments of the present invention eliminate the high bandwidth buffer from the analog chopper circuit. In some specific embodiments, the buffer is replace with a comparator-based loop that can be used to apply offset correction and achieve N-bit settling performance with sharp (up to 1 ns) rise and fall time with significantly lower power than with a buffer. Other specific embodiments include overcharging circuitry in combination with the comparator-based loop or in lieu of the comparator-based loop. Still other specific embodiments include an array of capacitors in place of the single large capacitor Clarge and use decoding/switching circuitry to selectively couple one of the capacitors into the circuit based on the DAC input code. Importantly, exemplary embodiments result in total power dissipation around the theoretical limit needed to charge the capacitor to the DAC output voltage.

14 Claims, 10 Drawing Sheets

Voffset is the offset due to Auxiliary Buffer

Offset = (Clarge *Voffset) / (Clarge+Cpar)

POWER-EFFICIENT CHOPPING SCHEME FOR OFFSET ERROR CORRECTION IN MEMS GYROSCOPES

FIELD OF THE INVENTION

The present invention relates generally to in-phase offset error correction in MEMS gyroscopes and more particularly to the correction of offset error arising due to drive force misalignment in gyroscopes.

BACKGROUND OF THE INVENTION

Gyroscope offset is an amplitude modulated signal and is typically corrected by applying a correction signal that is chopped at the resonant frequency of the gyroscope. The chopped correction signal typically comes from a buffered digital-to-analog converter (DAC) that is trimmed using N bits. The chopped signal is characterized by a sharp rise/fall time and quick settling. Achieving these attributes at low power is a challenge.

Typically, in applications where the analog signal is chopped and applied to sensors with large parasitic capacitive load (e.g., 5 pf to 6 pf), a high bandwidth buffer is used before the chopper to achieve the sharp rise/fall and quick settling. FIG. 1 is a schematic diagram showing a first analog chopper circuit as known in the art. Among other things, the analog chopper circuit includes a high bandwidth buffer 104 and a chopper 106 to process analog signals from digital-to-analog converter (DAC) 102 and provide chopped signals to sensor 110 via sensor parasitic load (Cpar) 108. The DAC 102 produces the analog signals based on a DAC input code 101. The high bandwidth buffer 104 is typically a switched capacitor differential buffer in order to avoid any resistive loading on the DAC, although other buffer architectures can be used in various alternative embodiments. FIG. 2 is a schematic diagram showing the chopped output of the circuit shown in FIG. 1. A significant amount of power is burnt in this buffer to achieve the required performance, and the power requirement of the buffer scales with the rise/fall time requirements. To illustrate an example of the bandwidth requirements of the buffer, in order to achieve rise and fall time of 5% of the chopping interval (½*fo), bandwidth of the buffer needs to be 10 times 2*fo, where fo is the resonant frequency of the sensor. The price paid in terms of power is high for achieving high bandwidth for a buffer driving higher sensor parasitic load (e.g., 5 pf to 6 pf).

As a solution to the previous problem, a large capacitor (Clarge) is typically placed ahead of the chopper (i.e., at the output of the buffer) in order to alleviate some of the bandwidth requirements of the buffer and provide instantaneous rise and fall (through charge sharing with sensor parasitic load Cpar 108) of the chopped output. FIG. 3 is a schematic diagram showing an analog chopper circuit with large capacitor (Clarge) 105 between the high bandwidth buffer 104 and the chopper 106. FIG. 4 is a schematic diagram showing the chopped output of the circuit shown in FIG. 3. Even though Clarge 105 alleviates the bandwidth requirements by allowing the use of a lower bandwidth buffer (e.g., 5 times the chopping interval of 2*fo is sufficient for more than 18 bits of settling), in order to achieve final settling, the buffer still has to burn a lot of power to drive this large capacitance (Clarge).

Various methods to detect and compensate for offset error in MEMS inertial sensors are described in U.S. Pat. No. 8,783,103 corresponding to US Patent Application Publication No. 2011/0041609 and in U.S. Pat. No. 8,677,801 corresponding to US Patent Application Publication No. 2014/0060186. One of the compensation methods described is implemented by chopping the correction signal at the resonant frequency of the sensor and applying it to the in-phase trim electrodes of the sensor.

SUMMARY OF EXEMPLARY EMBODIMENTS

In accordance with one embodiment of the invention, an analog chopper circuit comprises a capacitor having first and second terminals; a main comparator-based power loop having first and second inputs for receiving first and second main input voltage signals and having first and second outputs for providing first and second output current signals for charging the capacitor; and a chopper having first and second inputs respectively coupled to the first and second terminals of the capacitor and having first and second outputs respectively coupled to first and second terminals of a sensor parasitic load. The main comparator-based power loop is configured to provide output current signals for charging the capacitor when the voltage stored by the capacitor is below a voltage level represented by the first and second main input voltage signals and to stop providing output current signals when the voltage stored by the capacitor reaches said voltage level. The chopper is configured to chop an output voltage signal provided by the capacitor during a number of successive chopping intervals.

In one alternative embodiment, the main comparator-based loop comprises a first voltage-controlled current source having a control input for selectively enabling and disabling current flow and having an output for providing the first output current signal; a first comparator having a first input for receiving a first voltage signal from the capacitor, a second input for receiving the first main input voltage signal, and an output coupled to the control input of the first voltage-controlled current source; a second voltage controlled current source having a control input for selectively enabling and disabling current flow and having an output for providing the second output current signal; and a second comparator having a first input for receiving a second voltage signal from the capacitor, a second input for receiving the second main input voltage signal, and an output coupled to the control input of the second voltage controlled current source. The first and second comparators are configured to respectively enable the first and second voltage-controlled current sources when the voltage stored by the capacitor is below the voltage level and to respectively disable the first and second voltage-controlled current sources when the voltage stored by the capacitor reaches said voltage level.

In a second alternative embodiment, the analog chopper circuit further comprises a first switch having first and second inputs for receiving first and second source input voltage signals and having first and second outputs respectively coupled to the first and second inputs of the main comparator-based power loop; and a second switch having first and second terminals respectively coupled to the first and second outputs of the main comparator-based power loop and having third and fourth terminals respectively coupled to the first and second terminals of the capacitor. The first switch is configured to provide the first and second source input voltage signals on the first and second outputs such that the first and second source input voltage signals are swapped during each successive chopping interval. The second switch is configured to connect the first and second outputs of the main comparator-based power loop with the first and second terminals of the capacitor such that the connections are swapped during each successive chopping interval in synchronization with the first switch.

In a third alternative embodiment, the analog chopper circuit further comprises an overcharging circuit configured to overcharge the capacitor above the voltage level. The overcharging circuit may include an auxiliary power loop and a switching system for selectively coupling the capacitor to the auxiliary power loop and decoupling the capacitor from the auxiliary power loop. The overcharging circuit may be configured to operate a first phase within each chopping interval during which the capacitor is decoupled from the auxiliary power loop and is connected across the main comparator-based power loop, and to operate a second phase within each chopping interval during which the capacitor is disconnected from the main comparator-based power loop and is coupled to the auxiliary power loop for overcharging above the voltage level. The auxiliary power loop may include a resistive divider network that defines an amount of gain used to overcharge the capacitor, and the resistive divider network may be configured such that around 99% of the final chopped output voltage is achieved through charge-sharing in the first phase.

In accordance with another embodiment of the invention, an analog chopper circuit comprises a capacitor; a chopper for chopping a voltage provided by the capacitor during a number of successive chopping intervals; and an overcharging circuit for overcharging the capacitor above the input voltage, the overcharging circuit comprising a power loop and a switching system for selectively coupling the capacitor to the power loop and decoupling the capacitor from the power loop. The overcharging circuit is configured to operate a first phase within each chopping interval during which the capacitor is decoupled from the power loop and is connected to the chopper, and to operate a second phase within each chopping interval during which the capacitor is disconnected from the chopper and is coupled to the power loop for overcharging above the input voltage.

In one alternative embodiment, the auxiliary power loop may include a resistive divider network that defines an amount of gain used to overcharge the capacitor, wherein the resistive divider network may be configured such that around 99% of the final chopped output voltage is achieved through charge-sharing in the first phase.

In any of the above-described embodiments, the analog chopper circuit may include a capacitor array including a plurality of capacitors having different capacitor values, the capacitor array including the capacitor and further including switching circuitry configured to selectively route signals to and from the capacitor based on a digital value corresponding to an input voltage provided to the analog chopper circuit. The analog chopper circuit may include a digital-to-analog converter having first and second outputs respectively coupled to the first and second inputs of the main comparator-based power loop or to the first and second inputs of the first switch.

Additional embodiments may be disclosed and claimed.

BRIEF DESCRIPTION OF THE DRAWINGS

The foregoing features of embodiments will be more readily understood by reference to the following detailed description, taken with reference to the accompanying drawings, in which.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

Embodiments of the present invention eliminate the high bandwidth buffer from the analog chopper circuit. In some specific embodiments, the buffer is replaced with a comparator-based loop that can be used to apply offset correction and achieve N-bit settling performance with sharp (up to 1 ns) rise and fall time with significantly lower power than with a buffer. Other specific embodiments include overcharging circuitry in combination with the comparator-based loop or in lieu of the comparator-based loop. Still other specific embodiments include an array of capacitors in place of the single large capacitor Clarge and use decoding/switching circuitry to selectively couple one of the capacitors into the circuit based on the DAC input code. Importantly, exemplary embodiments result in total power dissipation around the theoretical limit of $C*V*V*f$ Watts needed to charge a capacitor to voltage V, where C is equal to (Clarge+Cpar) and V is equal to the DAC output voltage.

Figure 1:
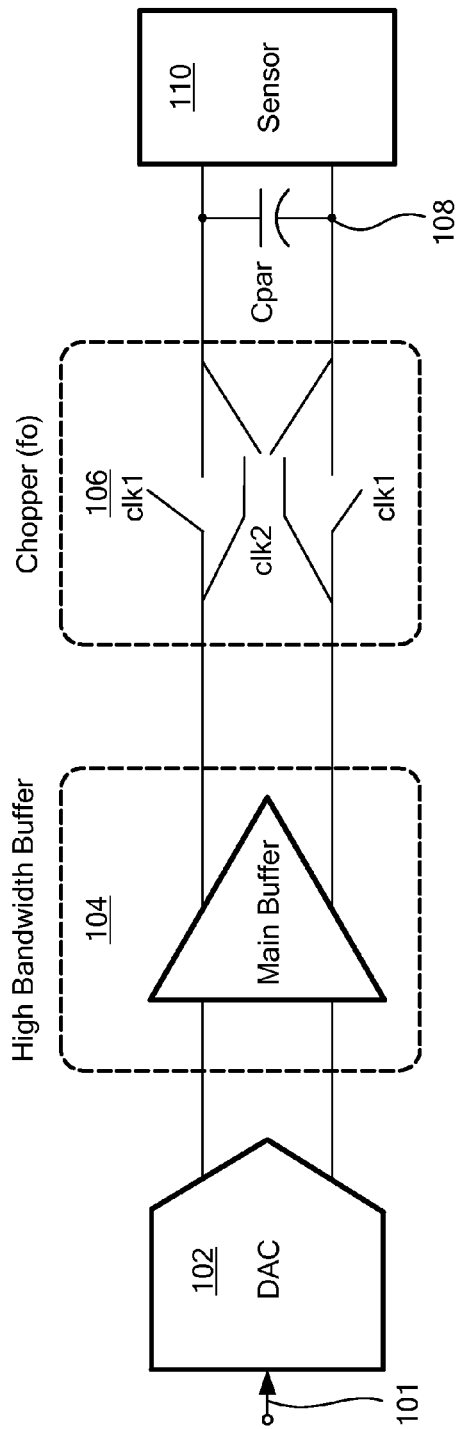
FIG. 1 is a schematic diagram showing a first analog chopper circuit as known in the art.
Figure 2:
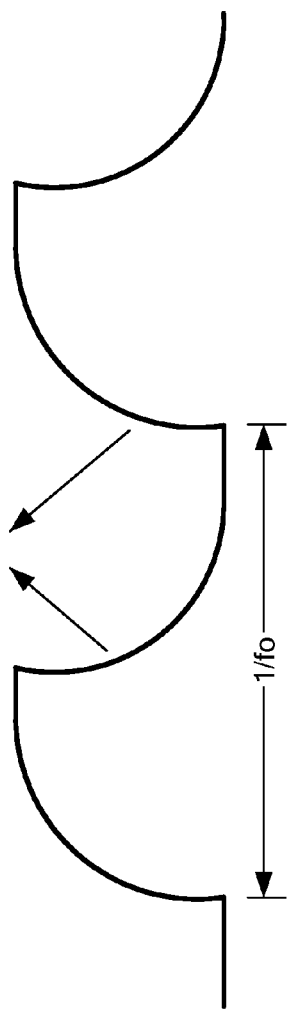
FIG. 2 is a schematic diagram showing the chopped output of the circuit shown in FIG. 1.
Figure 3:
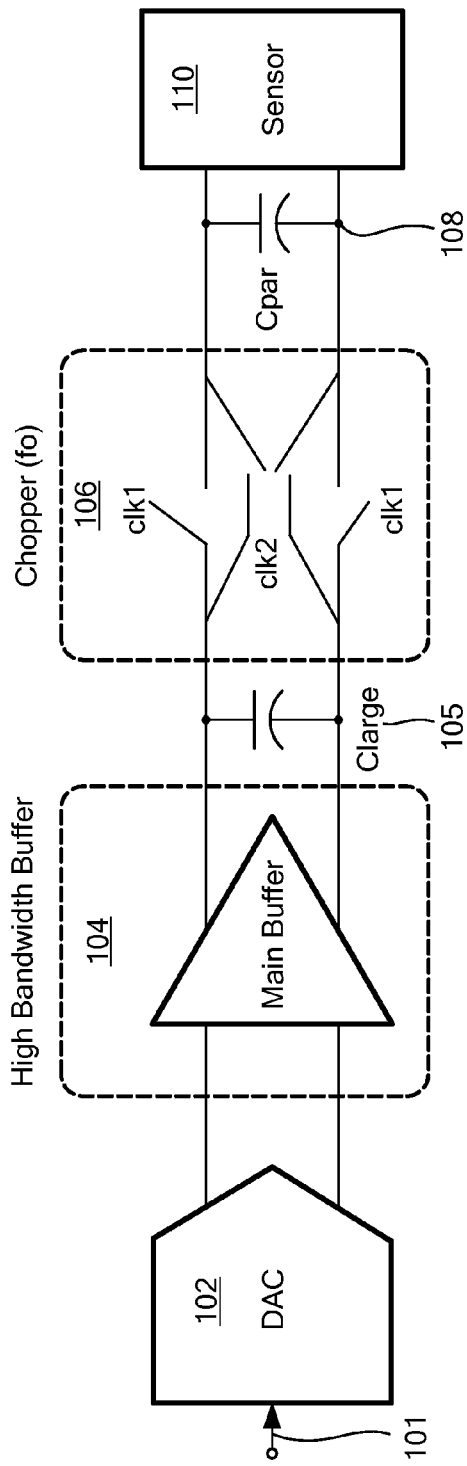
FIG. 3 is a schematic diagram showing a second analog chopper circuit as known in the art.
Figure 5:
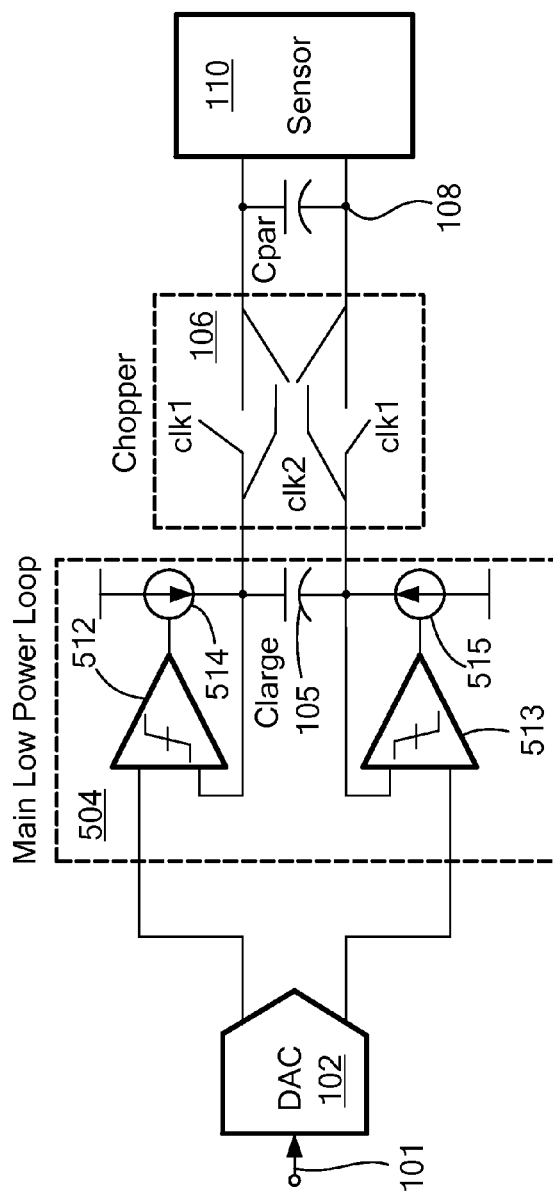
FIG. 5 is a schematic diagram showing a first analog chopper circuit in accordance with certain exemplary embodiments of the present invention.
Figure 6:
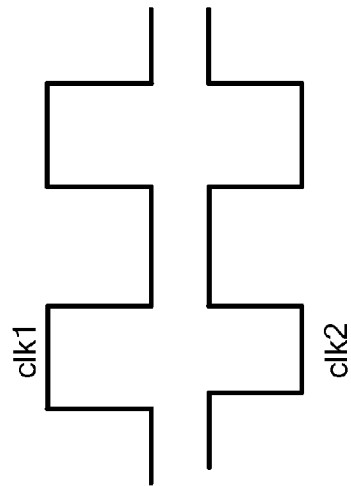
FIG. 6 shows the timing of non-overlapping chopping clocks clk1 and clk2 for the analog chopper circuit of FIG. 5, in accordance with one exemplary embodiment.

FIG. 5 is a schematic diagram showing a first analog chopper circuit in accordance with certain exemplary embodiments of the present invention. Compared to the analog chopper circuit of FIG. 1, here the analog chopper circuit includes a main low power loop 504 in place of buffer 104. The main low power loop 504 charges Clarge 105 by comparing the voltage on Clarge (chopped output) with the DAC output voltage via comparators 512, 513 and corresponding voltage-controlled current sources 514, 515. The comparators 512, 513 switch "ON" the voltage-controlled current sources 514, 515 while the charge on Clarge 105 is below the DAC output voltage and switch "OFF" the voltage-controlled current sources 514, 515 when Clarge 105 is charged to the DAC output voltage. The comparators 512, 513 ensure that the current sources 514, 515 will only be "ON" for a transient time until Clarge 105 charges to the DAC output voltage. After the current sources 514, 515 are switched "OFF'," Clarge 105 holds the voltage for the rest of the time during chopping phase clk1 and clk2. FIG. 6 shows the timing of non-overlapping chopping clocks clk1 and clk2, in accordance with one exemplary embodiment. Transient switching "ON" of the current sources 514, 515 ensures that power dissipation is no more than the theoretical limit of C*V*V*f. Also, higher bandwidth of the comparator can be achieved at lower power dissipation, since it drives only the input parasitic of the voltage-controlled current sources 514, 515. Total power dissipation in the loop is the sum of static power dissipation in the low power comparator and dynamic power dissipation (equal to theoretical limit C*V*V*f) through the current source while charging Clarge 105. As soon as the chopping clocks clk1/clk2 switch "ON," the charge on Clarge 105 is shared with Cpar 108, and this is almost an instantaneous phenomenon that provides a sharp rise and fall of the chopped output.

In the analog chopper circuit of FIG. 5, 1/f noise or offset from the comparators 512 can appear at the chopped output. This offset can be reduced or eliminated by swapping the comparators during each chopping cycle clk1/clk2.

Figure 7:
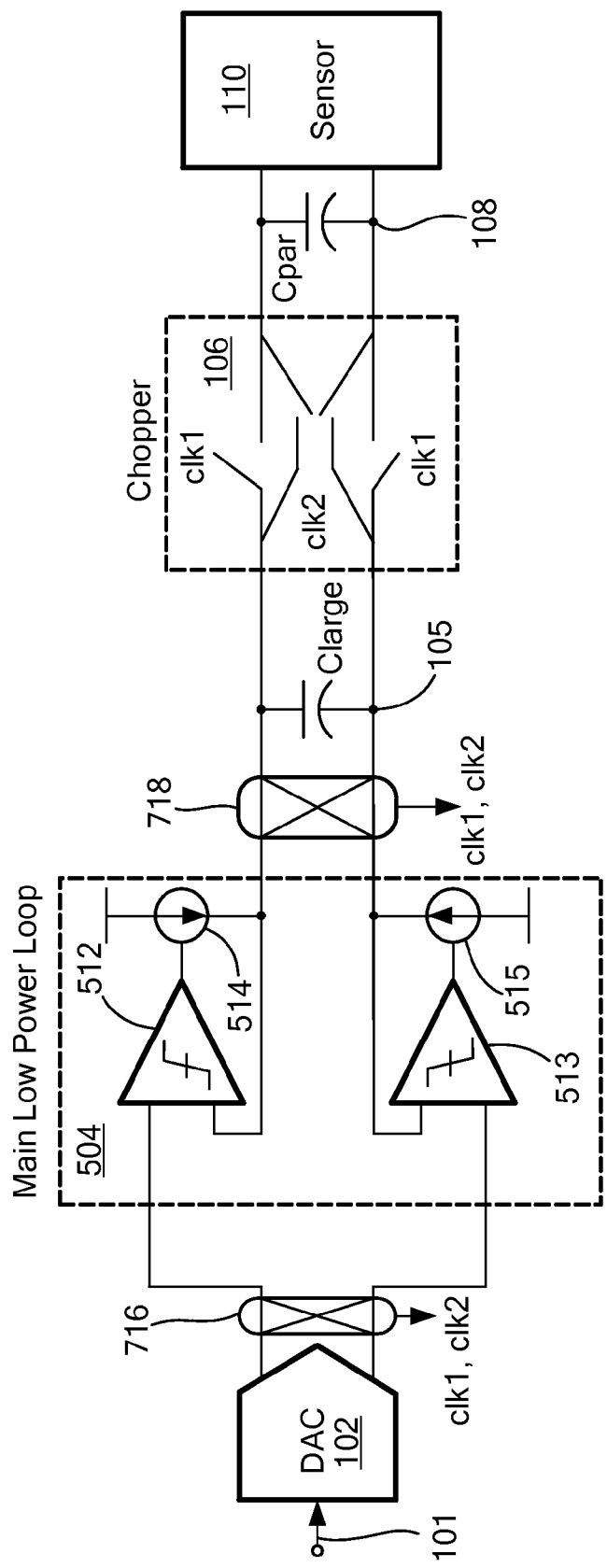
FIG. 7 is a schematic diagram showing a second analog chopper circuit in accordance with certain exemplary embodiments of the present invention.

FIG. 7 is a schematic diagram showing a second analog chopper circuit in accordance with certain exemplary embodiments of the present invention. Here, the comparators 512, 513 are swapped using a separate chopper 716 at the input of the main low power loop 504 and another separate chopper 718 at the output of the main low power loop 504 (i.e., before the final chopper 106) so that the offset appears at the chopped frequency while the signal remains at a low frequency (before the final chopper). In an exemplary embodiment, this circuit uses substantially the same timing for clk1 and clk2 as shown in FIG. 6.

In certain exemplary embodiments, the quality of the chopped waveform may be improved by overcharging Clarge to achieve both sharp rise and fall and quicker settling at lower power.

Figure 8:
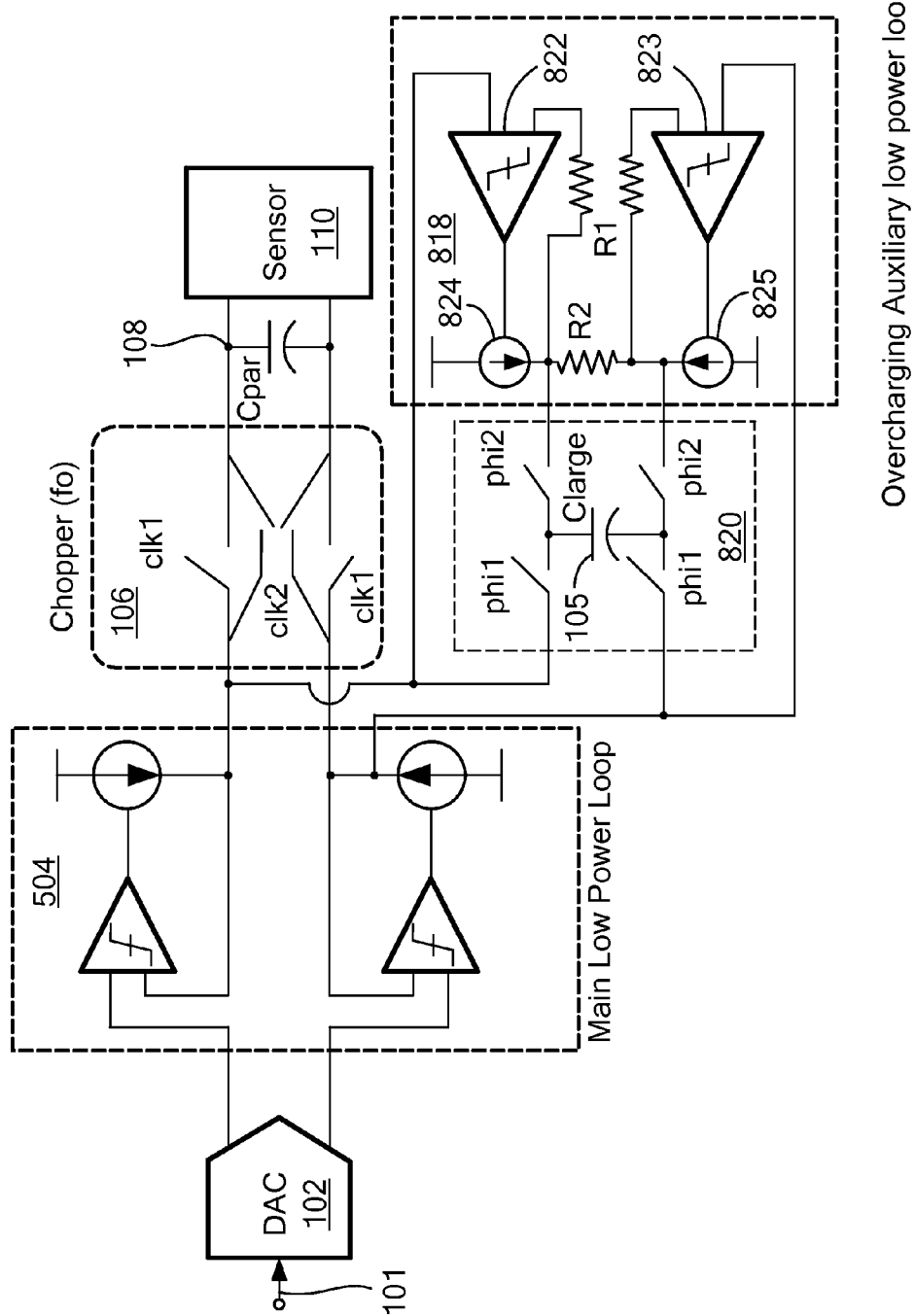
FIG. 8 is a schematic diagram showing a third analog chopper circuit in accordance with certain exemplary embodiments of the present invention.

FIG. 8 is a schematic diagram showing a third analog chopper circuit in accordance with certain exemplary embodiments of the present invention. This analog chopper circuit is similar to the analog chopper circuit of FIG. 5 but additionally includes an auxiliary low power loop 818 and associated switching circuitry 820 to perform overcharging of the large capacitor Clarge 105. The auxiliary low power loop 818 is formed by comparators 822, 823 and corresponding voltage-controlled current sources 824, 825 along with a resistive divider network (represented by resistors R1 and R2) and is used to charge Clarge 105 to gained-up version of DAC output as discussed below.

Figure 9:
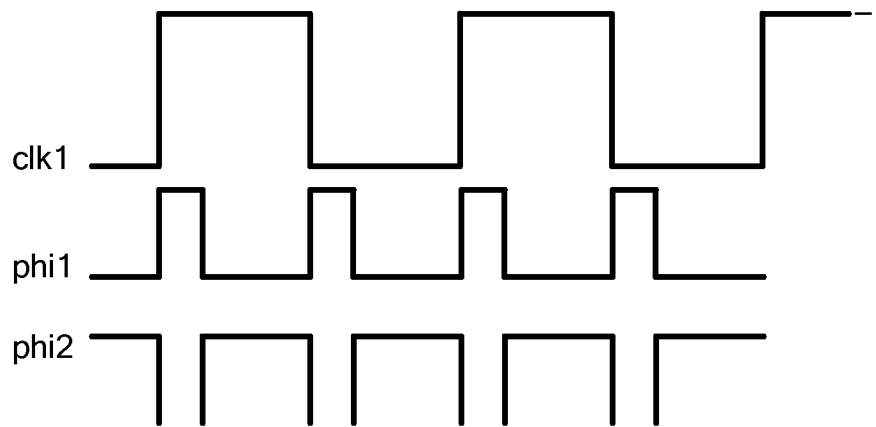
FIG. 9 shows the timing of clocks phi1 and phi2 with respect to chopping clocks clk1 and clk2 for the analog chopper circuit of FIG. 8, in accordance with one exemplary embodiment.

Operation of the overcharging scheme is divided into two phases within a chopping interval (1/(2*fo)), referred to as "phi1" and phi2," where phi1 and phi2 are based on non-overlapping clocks with a frequency of 2*fo. FIG. 9 shows the timing of clocks phi1 and phi2 with respect to chopping clocks clk1 and clk2 in accordance with one exemplary embodiment. During phi1, the large capacitor Clarge 105 (which in this exemplary embodiment is typically around 6*Cpar) is connected across the main low power loop 504 for a small time during which charge on Clarge 105 (which was stored in the previous phi2 phase) is shared with sensor parasitic load Cpar 108 to achieve instantaneous rise/fall through charge-sharing with the sensor parasitic load Cpar 108. The duration of phi1 is very short (typically 10 to 20 ns), since charge sharing is almost instantaneous. During phi2, Clarge 105 is disconnected from the main low power loop 504, and Clarge 105 is overcharged to a gained-up version of the DAC output through the auxiliary low power loop 818 and associated switching circuitry 820. At the same time, the chopped output is charged to its final voltage through the main low power loop 504.

Figure 4:
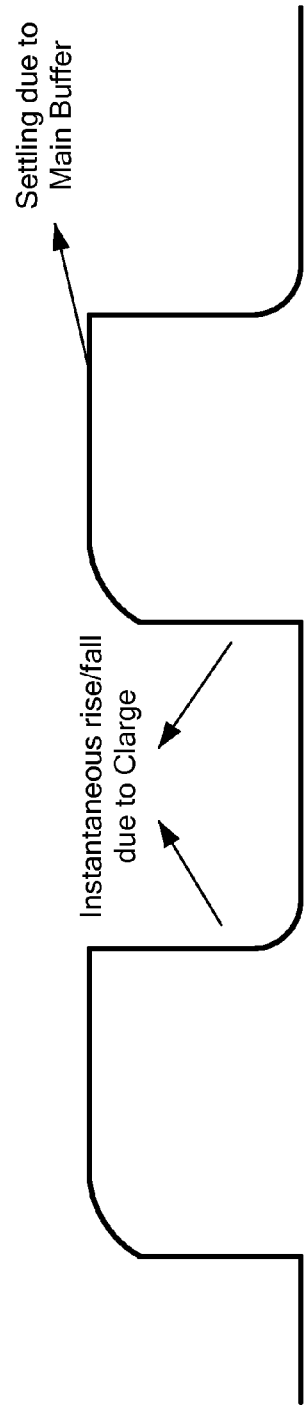
FIG. 4 is a schematic diagram showing the chopped output of the circuit shown in FIG. 3.
Figure 11:
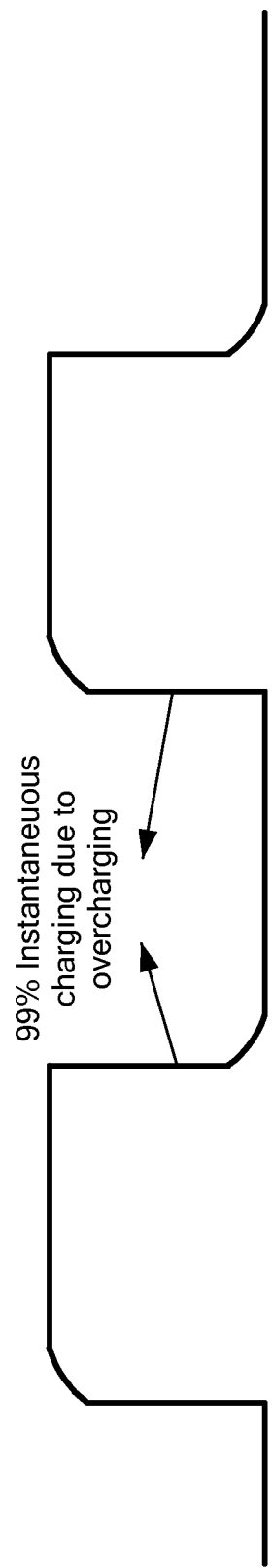
FIG. 11 is a schematic diagram showing the chopped output of the circuit shown in FIG. 8.

Overcharging to a gained-up version of the DAC output ensures that almost 99% of the final voltage is achieved instantaneously through charge-sharing in phase phi1. The remaining 1% of the final voltage is charged by the main low power loop 504 in phase phi2. The amount of gain for gaining-up the DAC output is defined by the resistive divider network (represented by resistors R1 and R2) in the auxiliary low power loop 818. The gain preferably is chosen such that after charge sharing in phase phi1, 99% of the final chopped output voltage is achieved instantaneously through charge-sharing in phase phi1. As shown in FIG. 11, with overcharging, the chopped waveform now more closely resembles an ideal square wave compared to the chopped waveform shown in FIG. 4. Total power dissipation in this configuration is:

$$Clarge*Vovercharge*Vovercharge*f+\\Cpar*V*V*f=C*V*V*f+Clarge*(Vovercharge-V)^2*f$$

Thus, total power dissipation in this exemplary embodiment is slightly higher than the theoretical limit of C*V*V*f, since Clarge is overcharged during phase phi2.

Figure 10:
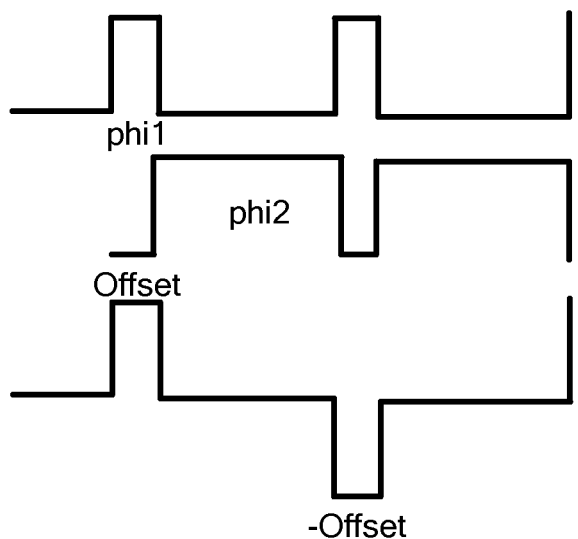
FIG. 10 shows the offset profile in the time-domain due to charging of Clarge 105 by the auxiliary low power loop of FIG. 8.

Analysis has shown that contribution of 1/f noise or offset due to the auxiliary low power loop 818 and switching circuitry 820 is minimal. Generally speaking, flicker noise can be considered as slowly varying offset. Any such offset from the auxiliary low power loop 818 (typically voltage coming out of a bandgap) is stored on Clarge 105 during the phi2 phase and is charge-shared with the parasitic sensor load Cpar 108 during the phi1 phase. During the phi2 phase, offset stored (in phase phi1) on Cpar 108 disappears because it is being charged by the main low power comparator-based loop (at the output of DAC). FIG. 10 shows the offset profile in the time-domain due to charging of Clarge 105 by the auxiliary low power loop 818—offset due to the DAC and the main low power comparator-based loop are not considered here. This offset is periodic with a frequency of (fo). Harmonic content is not important, since it is outside the band of interest of the sensor. The magnitude of the fundamental component fo is found by applying a Fourier series to the offset profile and can be characterized as follows:

$$Vfundamental=Offset*(4*\sin(\pi*\tau/T))/\pi \qquad \text{Eq. 1}$$

where τ is the duration of phase phi1 (typically 10 to 20 ns) and T is 1/fo.

For lower resonant frequencies (e.g., <100 kHz), the ratio τ/T is very low (e.g., <1/1000). Therefore, the following approximately can be used:

$$\sin(\pi*\tau/T)=\pi*\tau/T \qquad \text{Eq. 2}$$

Using the approximation of Eq. 2, Eq. 1 reduces to $$Vfundamental=Offset*(4*\tau/T) \qquad \text{Eq. 3}$$

Based on the above equation, it can be seen that the effect of offset on the output due to charging Clarge 105 during phase phi2 is negligible for lower values of fo.

It should be noted that, although the exemplary embodiments discussed above use a single large capacitor Clarge, various alternative embodiments replace the single large capacitor Clarge with an array of capacitors having different capacitance values, where an appropriate capacitor from among the array of capacitors is selectively coupled into the analog chopping circuit by appropriate decoding/switching circuitry based on the DAC input code. For example, the decoding/switching logic may be configured to selectively couple a first capacitor when DAC input codes are within a first range of values, selectively couple a second capacitor when DAC input codes are within a second range of values, and so on. Typically, the lowest range of DAC input codes would cause the capacitor having the lowest capacitance value to be selectively coupled into the circuit, the next higher range of DAC input codes would cause the capacitor having the next higher capacitance value to be selectively coupled into the circuit, and so on.

Figure 12:
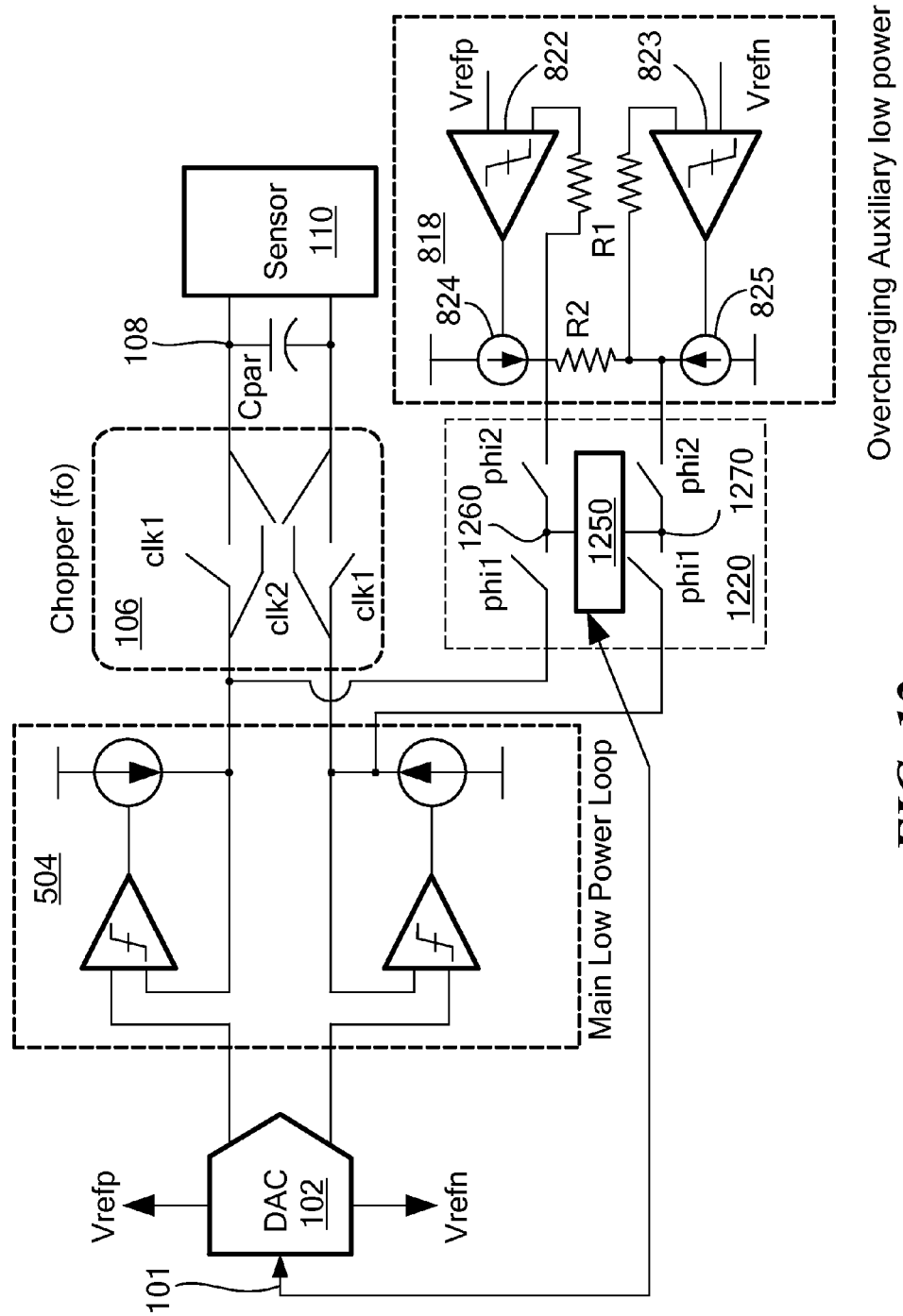
FIG. 12 is a schematic diagram showing a fourth analog chopper circuit in accordance with certain exemplary embodiments of the present invention.

FIG. 12 is a schematic diagram showing a fourth analog chopper circuit in accordance with certain exemplary embodiments of the present invention. This analog chopper circuit is similar to the analog chopper circuit of FIG. 8 but uses a capacitor array 1250 in place of the single large capacitor Clarge 105 in switching circuitry 1220. The capacitor array 1250 includes multiple capacitors having different capacitance values and selectively couples one of the capacitors into the circuit between connection points 1260 and 1270 based on the DAC input code 101, as discussed above. In this figure, Vrefp and Vrefn are the positive and negative reference voltages for the DAC 102, which are also used as the constant reference voltage inputs to comparators 822 and 823, respectively. Compared to FIG. 8, in which the charge on Clarge 105 changes based on the voltage change (i.e., dependent on DAC codes), in FIG. 12, charge on the capacitor is changed by switching the capacitors based on DAC codes and keeping the voltage constant, i.e., input to the comparators 822 and 823 is constant and the capacitors are switched based on DAC codes.

Figure 13:
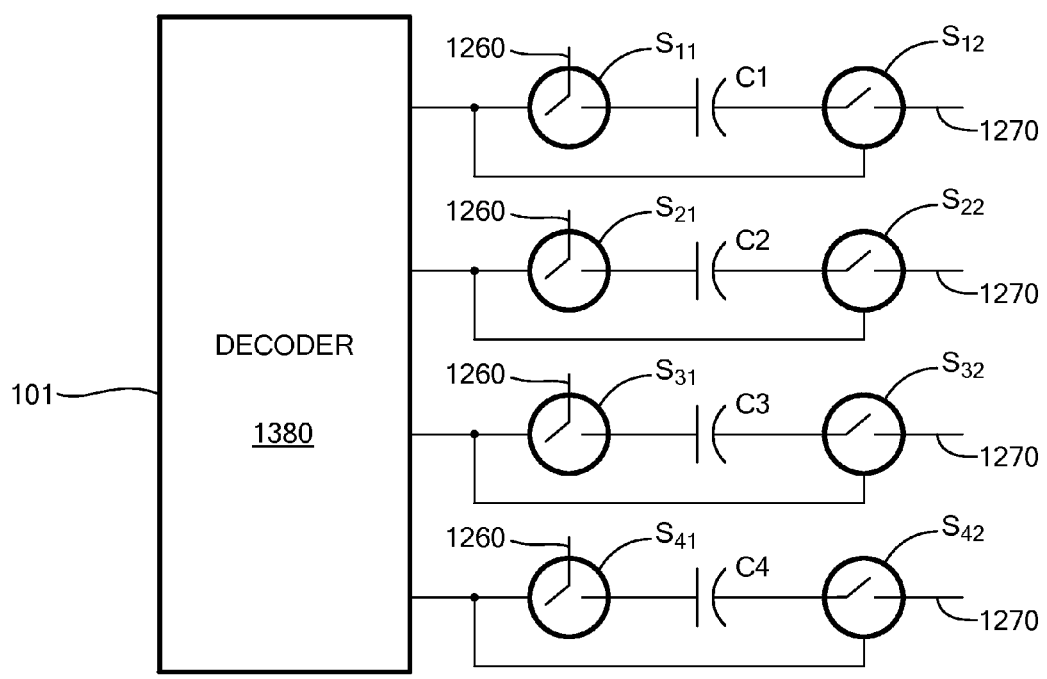
FIG. 13 is a schematic diagram showing relevant components of the capacitor array of FIG. 12, in accordance with a first exemplary embodiment.

FIG. 13 is a schematic diagram showing relevant components of the capacitor array 1250 in accordance with a first exemplary embodiment. Here, the capacitor array 1250 includes a decoder 1380 that selectively couples one of the capacitors C1-C4 between the circuit connection points 1260 and 1270 based on the DAC input code 1240. Specifically, if the decoder selects capacitor C1, then switches S11 and S12 are closed in order to couple capacitor C1 into the circuit; if the decoder selects capacitor C2, then switches S21 and S22 are closed in order to couple capacitor C2 into the circuit; if the decoder selects capacitor C3, then switches S31 and S32 are closed in order to couple capacitor C3 into the circuit; and if the decoder selects capacitor C4, then switches S41 and S42 are closed in order to couple capacitor C4 into the circuit. In this exemplary embodiment, the appropriate capacitor is connected to the DAC output in phase phi1 and overcharged to a constant voltage (Vrefp−Vrefn in this example) in phase phi2 of every switching cycle.

Figure 14:
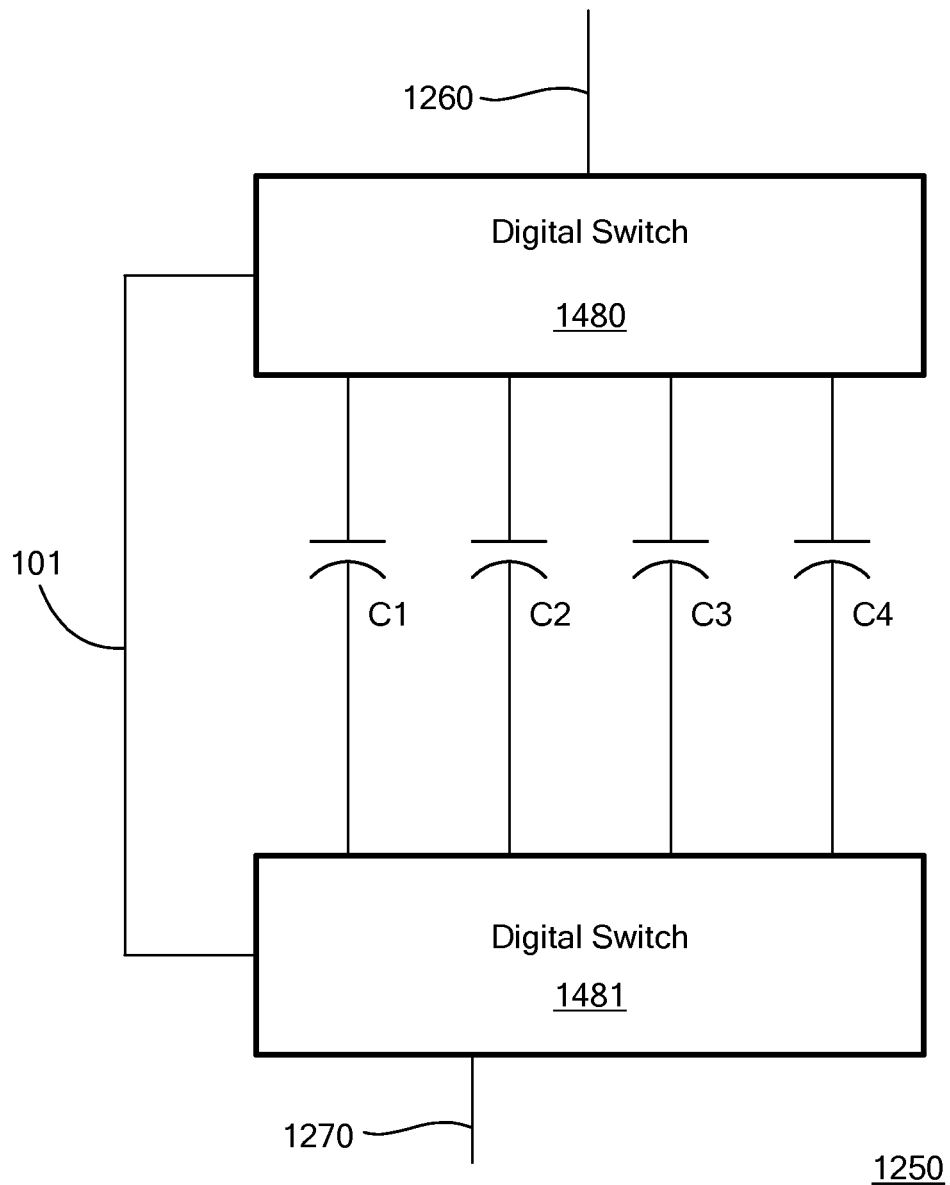
FIG. 14 is a schematic diagram showing relevant components of the capacitor array of FIG. 12, in accordance with a second exemplary embodiment.

FIG. 14 is a schematic diagram showing relevant components of the capacitor array 1250 in accordance with a second exemplary embodiment. Here, capacitors C1-C4 are coupled between two digital switches 1480 and 1481, which in turn are controlled by the DAC input code 1240.

It should be noted that a capacitor array can be used in place of the single large capacitor Clarge in any of the described embodiments, including the exemplary embodiments described above with reference to any of FIGS. 3, 5, 7, and 8. It also should be noted that any appropriate number of capacitors may be used in a capacitor array as desired for a particular implementation.

It should be noted that in certain gyroscopes (e.g., certain gyroscopes having a resonant frequency less than 10 KHz), the correction signal output by the DAC (e.g., a resistive string DAC) is capable of driving the sensor parasitic load Cpar and therefore can be chopped directly without buffering, such that the analog chopper circuit can include an overcharging circuit without the main low power loop.

It should be noted that arrows may be used in drawings to represent communication, transfer, or other activity involving two or more entities. Double-ended arrows generally indicate that activity may occur in both directions (e.g., a command/request in one direction with a corresponding reply back in the other direction, or peer-to-peer communications initiated by either entity), although in some situations, activity may not necessarily occur in both directions. Single-ended arrows generally indicate activity exclusively or predominantly in one direction, although it should be noted that, in certain situations, such directional activity actually may involve activities in both directions (e.g., a message from a sender to a receiver and an acknowledgement back from the receiver to the sender, or establishment of a connection prior to a transfer and termination of the connection following the transfer). Thus, the type of arrow used in a particular drawing to represent a particular activity is exemplary and should not be seen as limiting.

The present invention may be embodied in other specific forms without departing from the true scope of the invention, and numerous variations and modifications will be apparent to those skilled in the art based on the teachings herein. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. An analog chopper circuit comprising:
   a capacitor having first and second terminals;
   a main comparator-based power loop having first and second inputs for receiving first and second main input voltage signals and having first and second outputs for providing first and second output current signals for charging the capacitor; and
   a chopper having first and second inputs respectively coupled to the first and second terminals of the capacitor and having first and second outputs respectively coupled to first and second terminals of a sensor parasitic load, wherein:
   the main comparator-based power loop is configured to provide output current signals for charging the capacitor when the voltage stored by the capacitor is below a voltage level represented by the first and second main input voltage signals and to stop providing output current signals when the voltage stored by the capacitor reaches said voltage level; and
   the chopper is configured to chop an output voltage signal provided by the capacitor during a number of successive chopping intervals.

2. An analog chopper circuit according to claim 1, wherein the main comparator-based loop comprises:
   a first voltage-controlled current source having a control input for selectively enabling and disabling current flow and having an output for providing the first output current signal;
   a first comparator having a first input for receiving a first voltage signal from the capacitor, a second input for receiving the first main input voltage signal, and an output coupled to the control input of the first voltage-controlled current source;

a second voltage controlled current source having a control input for selectively enabling and disabling current flow and having an output for providing the second output current signal; and a second comparator having a first input for receiving a second voltage signal from the capacitor, a second input for receiving the second main input voltage signal, and an output coupled to the control input of the second voltage controlled current source, wherein the first and second comparators are configured to respectively enable the first and second voltage-controlled current sources when the voltage stored by the capacitor is below the voltage level and to respectively disable the first and second voltage-controlled current sources when the voltage stored by the capacitor reaches said voltage level.

3. An analog chopper circuit according to claim 1, further comprising:

a first switch having first and second inputs for receiving first and second source input voltage signals and having first and second outputs respectively coupled to the first and second inputs of the main comparator-based power loop; and a second switch having first and second terminals respectively coupled to the first and second outputs of the main comparator-based power loop and having third and fourth terminals respectively coupled to the first and second terminals of the capacitor, wherein:

the first switch is configured to provide the first and second source input voltage signals on the first and second outputs such that the first and second source input voltage signals are swapped during each successive chopping interval; and the second switch is configured to connect the first and second outputs of the main comparator-based power loop with the first and second terminals of the capacitor such that the connections are swapped during each successive chopping interval in synchronization with the first switch.

4. An analog chopper circuit according to claim 1, further comprising:

an overcharging circuit configured to overcharge the capacitor above the voltage level.

5. An analog chopper circuit according to claim 4, wherein the overcharging circuit comprises an auxiliary power loop and a switching system for selectively coupling the capacitor to the auxiliary power loop and decoupling the capacitor from the auxiliary power loop.

6. An analog chopper circuit according to claim 5, wherein the overcharging circuit is configured to operate a first phase within each chopping interval during which the capacitor is decoupled from the auxiliary power loop and is connected across the main comparator-based power loop, and wherein the overcharging circuit is configured to operate a second phase within each chopping interval during which the capacitor is disconnected from the main comparator-based power loop and is coupled to the auxiliary power loop for overcharging above the voltage level.

7. An analog chopper circuit according to claim 6, wherein the auxiliary power loop comprises a resistive divider network that defines an amount of gain used to overcharge the capacitor, and wherein the resistive divider network is configured such that around 99% of the final chopped output voltage is achieved through charge-sharing in the first phase.

8. An analog chopper circuit according to claim 1, further comprising:

a capacitor array including a plurality of capacitors having different capacitor values, the capacitor array including the capacitor and further including switching circuitry configured to selectively route signals to and from the capacitor based on a digital value corresponding to an input voltage provided to the analog chopper circuit.

9. An analog chopper circuit according to claim 1, further comprising:

a digital-to-analog converter having first and second outputs respectively coupled to the first and second inputs of the main comparator-based power loop.

10. An analog chopper circuit according to claim 3, further comprising:

a digital-to-analog converter having first and second outputs respectively coupled to the first and second inputs of the first switch.

11. An analog chopper circuit for chopping an input voltage, the analog chopper circuit comprising:

a capacitor;

a chopper for chopping a voltage provided by the capacitor during a number of successive chopping intervals; and an overcharging circuit for overcharging the capacitor above the input voltage, the overcharging circuit comprising a power loop and a switching system for selectively coupling the capacitor to the power loop and decoupling the capacitor from the power loop, wherein the overcharging circuit is configured to operate a first phase within each chopping interval during which the capacitor is decoupled from the power loop and is connected to the chopper, and wherein the overcharging circuit is configured to operate a second phase within each chopping interval during which the capacitor is disconnected from the chopper and is coupled to the power loop for overcharging above the input voltage.

12. An analog chopper circuit according to claim 11, wherein the power loop comprises a resistive divider network that defines an amount of gain used to overcharge the capacitor, and wherein the resistive divider network is configured such that around 99% of the final chopped output voltage is achieved through charge-sharing in the first phase.

13. An analog chopper circuit according to claim 11, further comprising:

a capacitor array including a plurality of capacitors having different capacitor values, the capacitor array including the capacitor and further including switching circuitry configured to selectively route signals to and from the capacitor based on a digital value corresponding to an input voltage provided to the analog chopper circuit.

14. An analog chopper circuit according to claim 11, further comprising:

a digital-to-analog converter having first and second outputs providing the input voltage.

* * * * *